United States Patent
Koerber et al.

(10) Patent No.: US 7,142,432 B2
(45) Date of Patent: Nov. 28, 2006

(54) OPERATING LEVER WITH DISPLAY ELEMENT

(75) Inventors: Werner Koerber, Betzenstein (DE); Kurt Michael Schaffer, Eckental (DE); Ralf Behrens, Nürnberg (DE)

(73) Assignee: Rittal Electronic Systems GmbH & Co. KG, Herborn (DE)

( * ) Notice: Subject to any disclaimer, the term of this patent is extended or adjusted under 35 U.S.C. 154(b) by 504 days.

(21) Appl. No.: 10/344,825

(22) PCT Filed: Aug. 17, 2001

(86) PCT No.: PCT/EP01/09525

§ 371 (c)(1),
(2), (4) Date: Feb. 14, 2003

(87) PCT Pub. No.: WO02/19786

PCT Pub. Date: Mar. 7, 2002

(65) Prior Publication Data

US 2004/0049903 A1    Mar. 18, 2004

(30) Foreign Application Priority Data

Aug. 17, 2000  (DE) .......................... 200 14 199 U

(51) Int. Cl.
*H05K 7/12*    (2006.01)

(52) U.S. Cl. ................ 361/754; 361/798; 361/801; 361/759; 361/740; 361/747; 439/160

(58) Field of Classification Search ................ 361/754, 361/798, 801, 759, 726, 732, 740, 747; 312/223.1, 312/223.2; 439/159, 160

See application file for complete search history.

(56) References Cited

U.S. PATENT DOCUMENTS

| 4,885,436 | A |   | 12/1989 | Pham et al. |
| 4,917,618 | A | * | 4/1990 | Behrens et al. ............. 439/157 |
| 5,309,325 | A | * | 5/1994 | Dreher et al. ............... 361/754 |
| 5,627,379 | A | * | 5/1997 | Bortolini .................... 250/551 |
| 5,940,276 | A | * | 8/1999 | Kurrer et al. ............... 361/754 |
| 5,959,843 | A | * | 9/1999 | Kurrer et al. ............... 361/754 |
| 6,094,353 | A | * | 7/2000 | Koerber et al. ............. 361/754 |
| 6,128,198 | A | * | 10/2000 | Kurrer et al. ............... 361/759 |
| 6,220,879 | B1 | * | 4/2001 | Ulrich ........................ 439/160 |
| 6,515,866 | B1 | * | 2/2003 | Ulrich ........................ 361/759 |
| 6,741,479 | B1 | * | 5/2004 | Korber et al. .............. 361/801 |
| 6,829,150 | B1 | * | 12/2004 | Larson ....................... 361/801 |
| 6,908,333 | B1 | * | 6/2005 | Larson ....................... 439/490 |
| 6,924,430 | B1 | * | 8/2005 | Koerber et al. ............ 174/52.4 |

FOREIGN PATENT DOCUMENTS

| DE | 31 47 056 A1 | 6/1983 |
| DE | 295 09 602 U1 | 8/1996 |
| DE | 295 09 603 U1 | 8/1996 |
| DE | 299 22 725.1 | 4/2001 |
| EP | 1 314 345 B1 | 8/2001 |
| JP | 07058462 | 3/1995 |
| JP | 11307964 | 11/1999 |
| WO | WO 96 42187 | 12/1996 |

* cited by examiner

*Primary Examiner*—K Cuneo
*Assistant Examiner*—Dameon E Levi
(74) *Attorney, Agent, or Firm*—Pauley Petersen & Erickson

(57) ABSTRACT

An operating element for the engaging and extraction of planar sub-assemblies, with a display element in the operating lever, a front element for a planar sub-assembly with operating element and component support for accommodating planar sub-assemblies.

12 Claims, 4 Drawing Sheets

OPERATING LEVER WITH DISPLAY ELEMENT

BACKGROUND OF THE INVENTION

1. Field of the Invention

This invention relates to an operating element for levering a flat module in and out, and to a front system for a flat module, having at least one such operating element, an associated flat module, as well as a component support for receiving such flat modules which can be levered in and out and have a front system.

2. Discussion of Related Art

An operating element for levering a flat module in and out and having an end element, which is prepared for being connected with a flat module and which has an operating lever, which is rotatably seated on the end element, is known from German Utility Model Application 299 22 725.1 (Siemens).

Customarily, such flat modules have electrical indicator elements which indicate the switched state of a control element of the front component, for example, and are customarily separately integrated into the front plate of the front component. Separate structural space is required for this purpose.

SUMMARY OF THE INVENTION

One object of this invention is to provide an operating element for levering a flat module in and out, which has an electrical indicator element attached in a particularly space-saving manner. Furthermore, this invention provides an associated front system for such a flat module, as well as a component support for receiving such flat modules which can be levered in and out and have a front system.

In connection with the operating element, the object is achieved by features of this invention as described in this specification and in the claims. In connection with the front system, the object is achieved by the flat module and by the component support described in this specification and in the claims.

The operating lever of the operating element in accordance with this invention has at least one electrical indicator element, in particular an LED component. With this it is possible, for example, to indicate the switched state of a control element integrated into the operating element. In contrast to the prior art, no separate structural space is required with the operating element of this invention, for example in the front plate of the flat module. In accordance with this invention, the electrical indicator element is attached in a space-saving and compact manner to the operating lever of the operating element.

The indicator element can be connected in various ways with the operating element and can be attached, for example, as a module, or as a complementary element to the exterior of the operating element.

In accordance with one embodiment, the indicator element is partially or completely integrated into the handle element of the operating lever. Thus the indicator element can be viewed in a particularly dependable way by the user.

In accordance with a further embodiment, the indicator element is partially or completely integrated into a locking element of the operating element. Thus, the indicator element is attached a short distance away from the electrical current supply contacts of the flat module.

A particularly structural space-saving embodiment is achieved if the indicator element is received in recesses of the handle element or of the operating element and therefore requires only little additional structural space with respect to the present surface of the handle element, or of the operating element, or terminates flush with the respective surfaces.

In accordance with a further embodiment, the operating element can also have several indicator elements, which are attached to the handle element and/or to the operating lever. Thus, various switched states of the control element can be indicated, and differentiated information can be visually transmitted.

If the operating element has an integrated control element which, in the course of levering the flat module in and out, can be switched to be active or passive by operating the operating lever, the electrical indicator element is particularly used for indicating the switched state of the control element.

If the control element has current by the flat module via connecting contacts, the indicator element is electrically connected for electrical current supply with the circuit element in particular. This electrical connection can be provided by releasable clamping contacts, so that while pulling the flat module out of the component support, and therefore when levering the operating lever out, and/or when placing the locking element of the operating lever into a second switched position (B), a disruption of the electrical connection between the indicator element and the circuit element occurs. It is further possible to provide a separate electrical current supply for the indicator element.

A front plate of the front system for a flat module in accordance with this invention has at least one operating element in accordance with this invention, wherein an electrical indicator element is attached to the operating lever of the operating element.

A flat module is provided, which has a front system with an operating element in accordance with this invention.

Finally, this invention includes a component support, into and out of which flat modules with front systems having an operating element in accordance with this invention can be levered.

BRIEF DESCRIPTION OF THE DRAWINGS

This invention is explained in greater detail in view of exemplary embodiments in the drawings, wherein.

DESCRIPTION OF PREFERRED EMBODIMENTS

Figure 1:
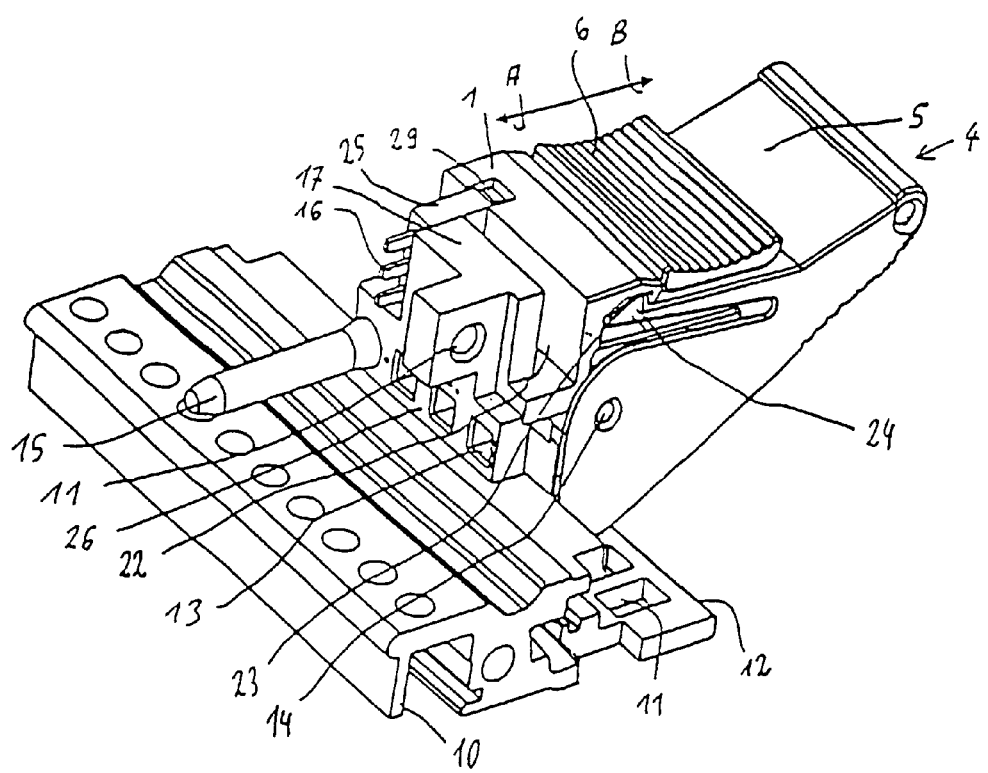
FIG. 1 is a perspective lateral view of a basic embodiment of an operating element in accordance with prior art.
Figure 2:
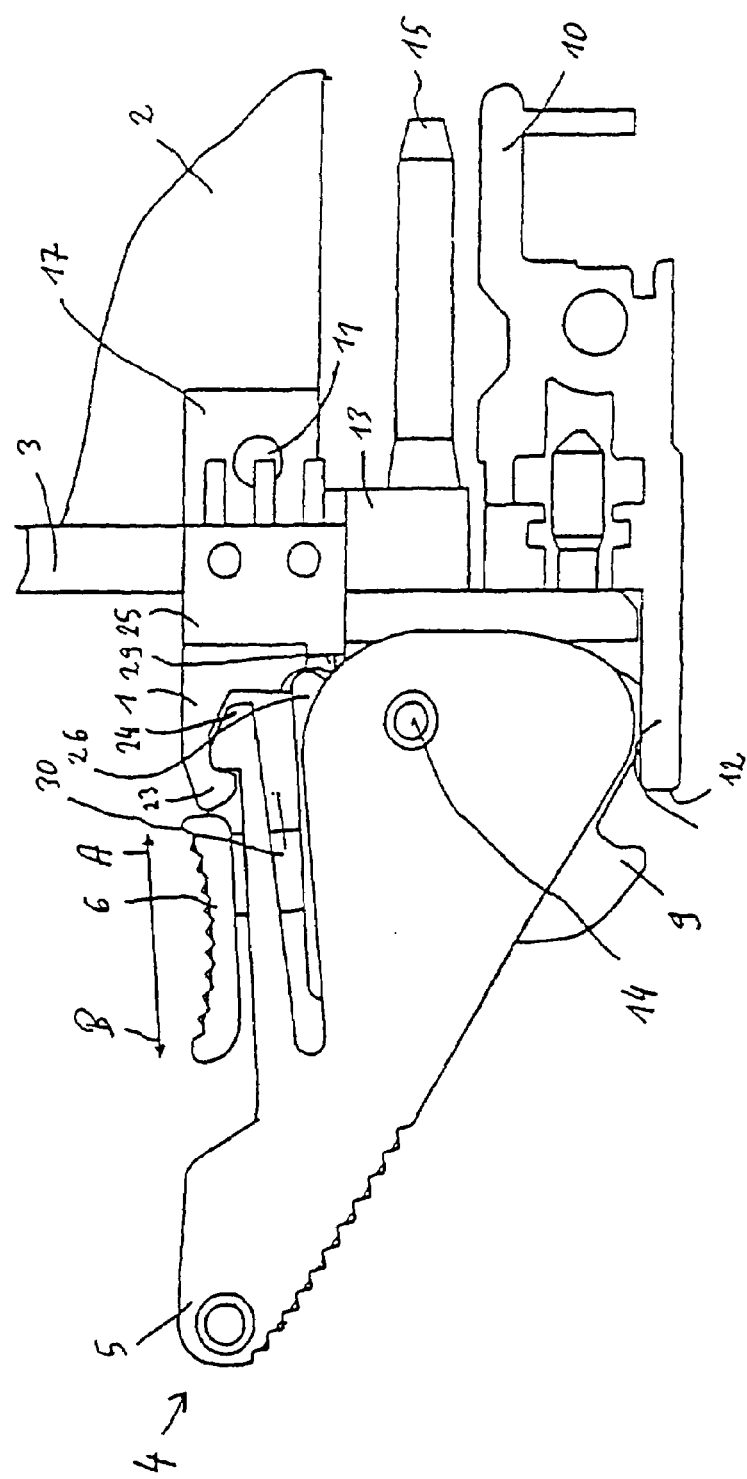
FIG. 2 is a lateral plan view of a front system for a flat module, having an operating element in accordance with the prior art shown in FIG. 1.

An operating element in accordance with prior art for levering a flat module 2 with an end element 1 for connection with a flat module 2 and a front plate in and out is shown in FIG. 1 and FIG. 2.

In this case the operating element rests on a lower transverse rail 10 of a component support and has as its main components an operating lever 4, and end element 1 and a front plate 3, not shown for reasons of clarity in FIG. 1. The end element 1 has a central holding function because it is used as the support for an operating lever 4 which is rotatably seated in a bore 14 in particular. The end element 1 can also be used for holding the lower end of the front plate 3, which is advantageously inserted into a groove 22 for this purpose.

The connection between the lower end element 1 and the front lower corner of the flat module 2, as shown in FIG. 2, is advantageously provided via a holding block 17 with a screw engaging a bore 11.

Finally, still further components can be attached on the end element 1 of FIG. 1. Thus, the end element 1 represented in FIG. 1 contains a coding block 13, into which coding chambers 27 for the insertion of coding pins, not shown, are cut. They can engage coding chambers attached oppositely to the lower transverse rail 10, which have complementary coded coding pins. Thus only one definitely selected flat module 2 can be positioned in a plug-in location of a component support. A guide pin 15 is provided which, following its engagement with an oppositely located guide bore, not shown, assures a tilt-free correct insertion of the flat module 2.

The operating lever 4, which can be actuated by operating the handle element 5 when the locking element 6 is brought into the switched position (B), is used for levering the flat module into or out of the appropriate plug-in location.

For levering out, the operating lever 4 is pushed down, so that a levering-out projection 9 protruding from the underside can be supported on a front edge 12 of the lower transverse rail 10. For reversing this, it is necessary while levering-in to push the operating lever 4 upward, so that at least one levering-in edge 8, also projecting from the underside, can be supported inside at least one engagement depression 11 also located in the area of the front edge 12 of the lower transverse rail 10.

Customarily, means are provided on the end element 1, through which the operating lever 4 can be fixed in place in the appropriate position after reaching the state in which it is completely inserted into the flat module. This inserted state is shown in FIG. 1. Thus, the operating lever 4 advantageously has a resilient, upward extending detent protrusion 24 on its top, which is directed toward the end element 1 and extends behind a detent edge 23 on the end element 1 which is directed toward the actuation lever 4 and extends downward.

In the same manner, a corresponding arrangement is attached to the corner area of the flat module 2 shown in FIG. 2, which includes an upper end element 3 with an operating lever 4 rotatably seated thereon. The operating lever 4 engages a corresponding upper transverse rail of a component support, not shown, for levering-in and levering-out.

A control element 25 is integrated in the lower or upper end element of the operating element in accordance with the prior art shown in FIG. 1 and FIG. 2, which is actuated by the operating lever 4 when it is in its fixed position, switched position A. Thus it is possible to electrically clear the flat module 2 attached to the operating lever 4, for example by activating its electrical current supply. In the other way the flat module 2 can also be switched electrically passive so that at the moment the flat module 2 is levered out, the action of the operating lever 4 on the control element 25 integrated into the end element 1 ends, and the electrical current supply for the flat module 2 is passivated again by the release of the control element 25.

The control element 25 is seated in a receiving slot 28 extending as far as the area of the detent edge 23 of the end element 1. Thus a switching element of the control element 25, for example a switching lever 29, projects into the area below the downward sloping detent edge 23 and, when the fixed state of the operating lever 4, switched position A is reached, is actuated by the switching slide 26 of the locking element 6 of the operating lever 4 when the operating lever is in position A. The locking element 6 is connected with the switching slide 26 via a connecting element 30.

If the operating lever 4 is displaced into the position B, as shown in FIG. 2, the switching element 29 is relieved and the control element 25 is switched into a second switched state, and a passivation of the flat module 2 occurs.

The levering-out of the operating lever 4 can occur when a handle element 5 is moved downward, in the direction of the transverse rail 10, so that the detent projection 24 of the operating lever 4 is resiliently released from the detent edge 23 of the end element 1. The control element 25 can be activated or passivated by displacing the locking element 6 between the positions A and B in FIG. 2, and this is independent of the complete release of the operating element by the described downward levering-out of the operating lever 4 for removing the flat module 2 from the component support.

Further details regarding the structure of the operating element in accordance with the prior art in FIGS. 1 and 2, and in particular regarding the functioning of the locking element 6, are described in German Utility Model application 299 22 725.1, the entire content of which disclosure is explicitly incorporated into this specification, by reference.

The integrated control element 25 can be advantageously electrically connected with the flat module 2 by a cable or cable-plug connector, which can be attached to its connecting contacts 16.

Thus it is possible to operate the control element 25 always dependably and wear-free with the operating element if the switching part or means of the control element 25 have only a very short switching path.

Because the active-passive switching function is completely integrated into the operating element, users of the front system are not subjected to any restrictions regarding the control of components on a flat module equipped with such a front system. In particular, no dimensionally exact position determinations with respect to electrical connections for the control element 25 are required.

Figure 3:
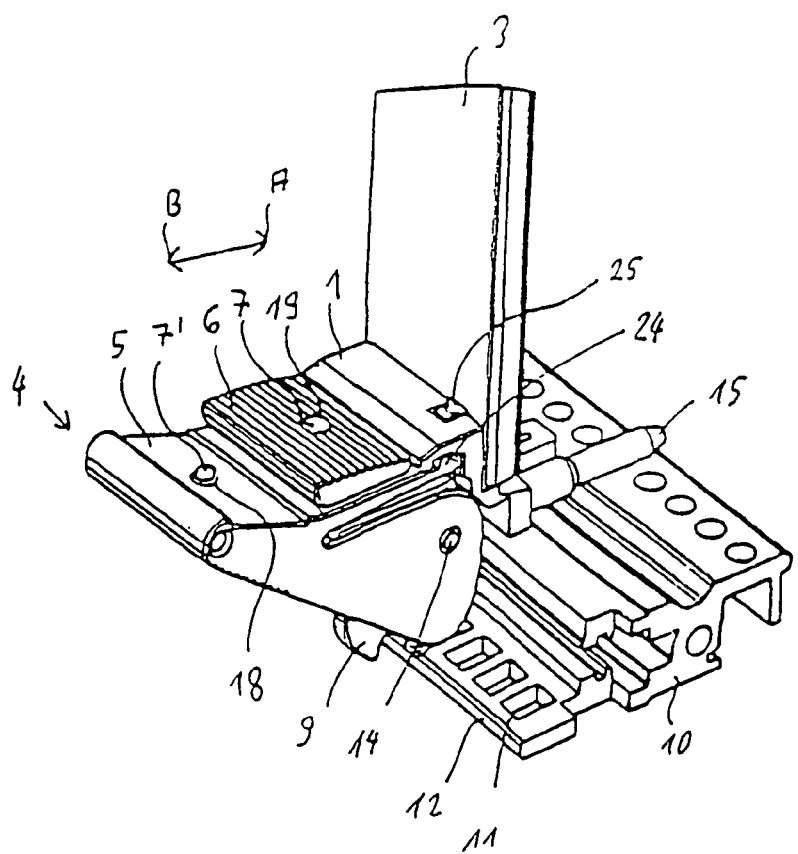
FIG. 3 is a perspective plan view of a basic embodiment of an operating element in accordance with this invention.
Figure 4:
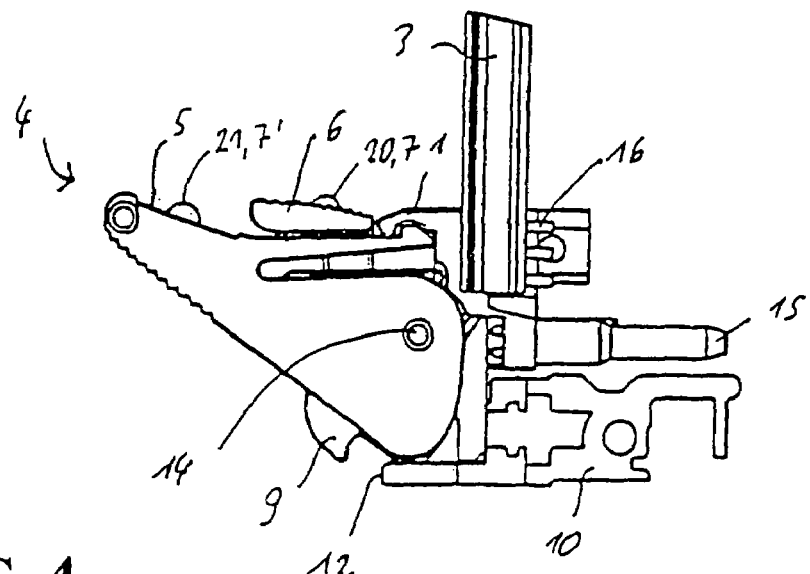
FIG. 4 is a lateral view of the embodiment shown in FIG. 3.
Figure 5:
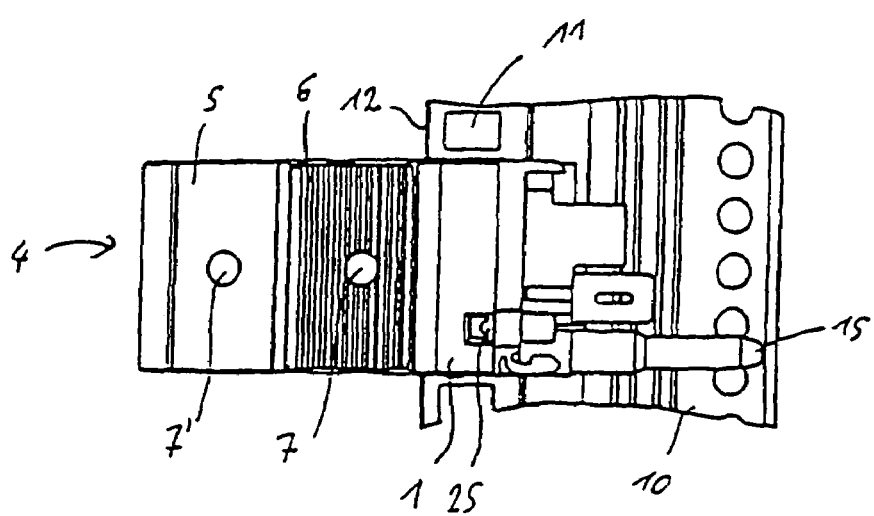
FIG. 5 is a top view of the embodiment shown in FIG. 3.

To the extent the structure of the operating system in accordance with this invention as shown in FIGS. 3 to 5 corresponds to the structure in accordance with the prior art in FIG. 1 and FIG. 2, identical reference numerals are employed, which have the functions shown in and according to the description of FIG. 1 and FIG. 2 without needing supplementary explanations.

FIG. 3 shows an electrical indicator element 7, which is integrated into a recess 19 of the locking element 6 of the operating lever 4. With this it is no longer necessary for the indicator element to be applied to the front plate 3, instead it is located in a space-saving manner in the operating lever 4 of the operating element. Furthermore, an electrical indicator element 7' is shown, which is integrated into a recess 18 of the handle element 5 of the operating lever 4.

The indicator element 7 is used for the indication of switched states of the control element 25, which is integrated into the end element 1 of the operating element.

The indicator element 7 is electrically connected with the control element 25, for electrical current supply, and for the transmission of information, for example regarding the switched state of the control element 25. Here, the electrical current supply for the indicator element 7 has the connecting contacts 16 of the control element 25.

If the locking element 6 is in the position B, and the operating element can be levered out downward in the direction of the transverse rail 10, the electrical current supply to the electrical indicator elements 7, 7' is interrupted. The indicator elements 7, 7' have connecting contacts known for this purpose, which can be connected in turn via known clamping contacts, with fixed contacts on the end element 1 for making a releasable electrical connection, not shown.

With the electrical indicator element 7 received in the locking element 6, the former can be displaced into the switched positions A and B by the locking element 6. For this it is necessary to provide electrical movement contacts, known per se, for example contact rails, for the electrical current supply of the indicator elements 7, 7'.

With an integrated indicator element 7' integrated in a handle element 5, such an electrical current supply by movement contacts of the indicator element 7' can be omitted. However, it is still necessary to provide an interruptible electrical current supply with the flat module 2, for example with the connecting contacts of the control element 25, in order to provide an interruption of the electrical current supply of the indicator element 7 when the operating lever 4 is levered out.

FIG. 4 shows the indicator elements 7, 7' received in the locking element 6, or the handle element 5, whose surfaces 20, 21 each protrude past the locking element 6 and the handle element 5. Because of this the electrical indicator elements 7, 7' can also be viewed better from the side and can be better seen by the user.

In accordance with FIG. 5, the indicator elements 7, 7' are substantially placed centered in the locking element 6, or the handle element 5 and thus can be viewed equally from both sides by the user.

In accordance with the view from above on the operating element in FIG. 5, the indicator elements 7, 7' are substantially placed centered in the locking element 6 and in the handle element 5 of the operating lever 4, so that they can be viewed equally well from all sides of the operating element.

The invention claimed is:

1. In an operating element for inserting and removing a flat module (2) by leverage, the operating element having an end element (1) which can be connected with the flat module (2), a rotatably seated operating lever (4) with a handle element (5), and a locking element (6), wherein the operating lever (4) can be fixed in place by ((a)) the locking element (6) in a state where it is connected with the pushed-in position of the flat module (2), and wherein the operating element has a control element (25) which, in the pushed-in state and with the operating lever (4) fixed in place, can be fastened, and electrically switches on the flat module (2), the improvement comprising:
   one of the operating lever (4) and the locking element (6) having at least one electrical indicator element (7) which, in the locked pushed-in position of the operating lever (4), can be switched on by actuating the control element (25),
   wherein the indicator element (7) is electrically connected with the control element (25) and the indicator element (7) is interrupted as a function of a position of the operating lever (4).

2. In the operating element in accordance with claim 1, wherein the electrical indicator element (7) is attached to the handle element (5) of the operating lever (4).

3. In the operating element in accordance with claim 2, wherein the indicator element (7) is partially integrated into the handle element (5).

4. In the operating element in accordance with claim 2, wherein the indicator element (7) is completely integrated into the handle element (5).

5. In the operating element in accordance with claim 4, wherein the indicator element (7) is received in a recess (18) of the handle element (5).

6. In the operating element in accordance with claim 1, wherein the indicator element (7) is attached to the locking element (6).

7. In the operating element in accordance with claim 6, wherein the indicator element (7) is partially integrated into the locking element (6).

8. In the operating element in accordance with claim 6, wherein the indicator element (7) is completely integrated into the locking element (6).

9. In the operating element in accordance with claim 8, wherein the indicator element (7) is received in a recess (19) of the locking element (6).

10. In the operating element in accordance with claim 1, wherein the control element (25) is integrated into the end element (1).

11. In the operating element in accordance with claim 2, wherein the indicator element (7) is received in a recess (18) of the handle element (5).

12. In the operating element in accordance with claim 6, wherein the indicator element (7) is received in a recess (19) of the locking element (6).

* * * * *